United States Patent [19]

Perrotta et al.

[11] Patent Number: 4,800,570
[45] Date of Patent: Jan. 24, 1989

[54] CONCATENATED CODE-DECODE SYSTEM FOR THE PROTECTION AGAINST INTERFERENCE OF DIGITAL TRANSMISSIONS THROUGH AN INTERMEDIATE REGENERATIVE REPEATER

[75] Inventors: Giorgio Perrotta; Giacinto Losquadro, both of Rome, Italy

[73] Assignee: Selenia Spazio S.p.A., L'Aquila, Italy

[21] Appl. No.: 44,888

[22] Filed: Apr. 30, 1987

[30] Foreign Application Priority Data

May 15, 1986 [IT] Italy ................. 48024 A/86

[51] Int. Cl.[4] ............................................. H03K 11/00
[52] U.S. Cl. .................................. 375/4; 455/20
[58] Field of Search ................ 375/4; 455/11, 12, 20, 455/23; 370/124, 97, 75, 13.1, 15, 104, 55

[56] References Cited

U.S. PATENT DOCUMENTS 3,944,723  3/1976  Fong ........................................ 375/4
4,354,054  10/1982  Bellisio ................................... 375/4

*Primary Examiner*—Robert L. Griffin
*Assistant Examiner*—Marianne Huseman
*Attorney, Agent, or Firm*—Bryan, Cave, McPheeters & McRoberts

[57] ABSTRACT

A digital signal to be transmitted (TXSG) is encoded through an external code device (EXCD); digital signal TXSG' so obtained (with a bit rate greater than TXSG) is used to modulate, through modulator MOD 1, a transmission carrier later amplified by transmitter TEQ 1 and radiated by antenna ANT1. The RF carrier sent by the transmitter is received by an intermediate transponder through antenna ANT2, receiver REQ2 and demodulator DEM1, which reconstitutes signal TXSG', save for transmission errors. The signal so received is once again encoded by internal coder INCD, obtaining a new digital signal TXSG", which has a bit rate even higher than TXSG'. This TXSG" signal is then used to modulate a second RF carrier by means of MOD2 modulator. The resulting signal is amplified by TEQ2 and radiated by antenna ANT3.

The RF signal sent by the transponder is received by the receiver terminal through ANT4 and, through receiver (REQ2) and demodulation (DEM2) units, a RXSG" signal is rebuilt, coinciding, save for transmission errors, with signal TXSG". Such signal is decoded by internal decoder INDC, thereby obtaining a signal RXSG' which, save for transmission errors, coincides with signal TXSG'.

This last signal is decoded by external decoder EXDC so as to rebuild signal RXSG which, save for transmission errors, coincides with transmitted signal TXSG.

15 Claims, 1 Drawing Sheet

Block Diagram of the Concatenated code-decode system

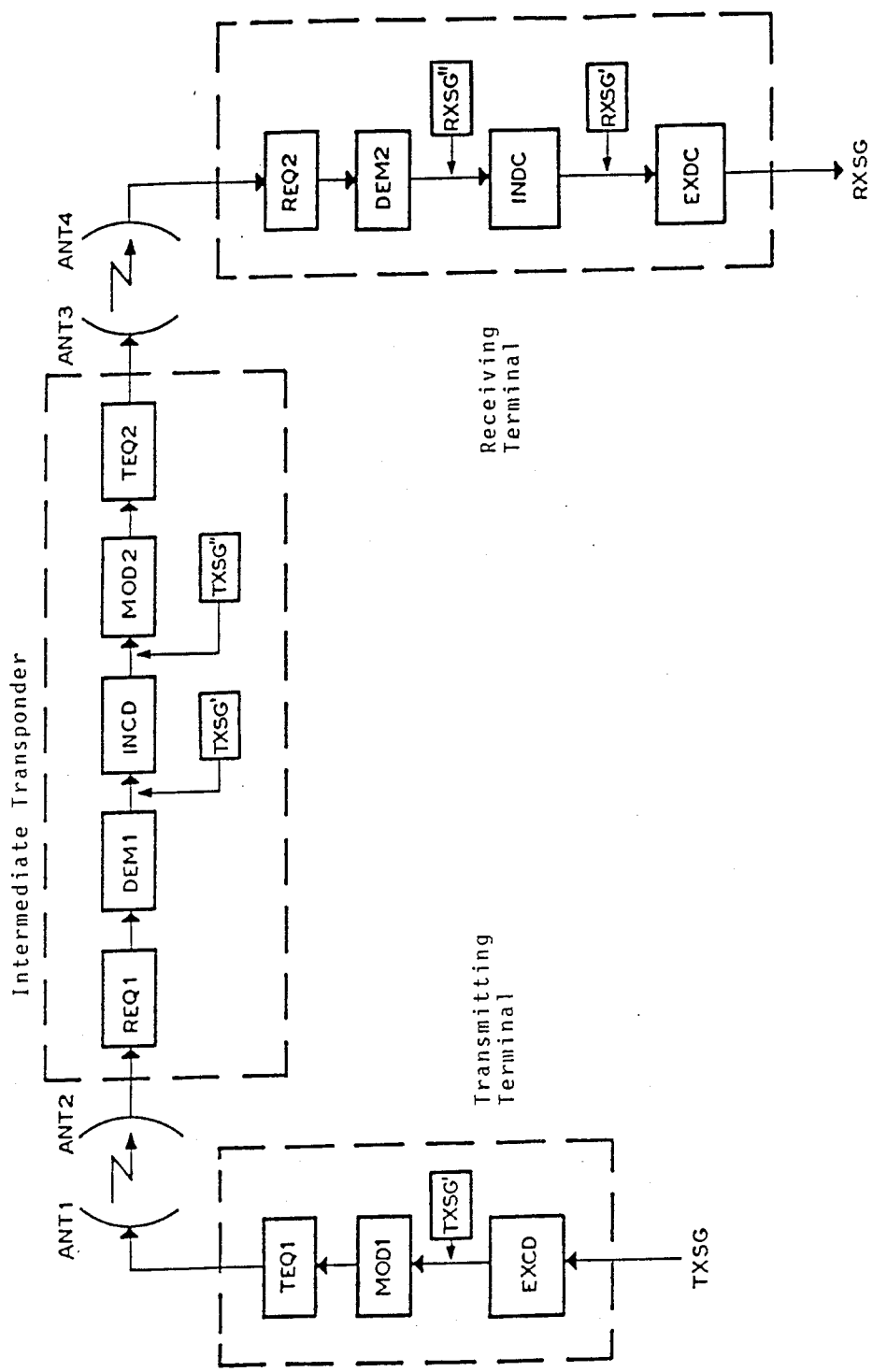
FIG. 1    Block Diagram of the Concatenated code-decode system

CONCATENATED CODE-DECODE SYSTEM FOR THE PROTECTION AGAINST INTERFERENCE OF DIGITAL TRANSMISSIONS THROUGH AN INTERMEDIATE REGENERATIVE REPEATER

BACKGROUND AND SUMMARY OF THE INVENTION

The invention relates to code-decode systems for protecting digital signal transmissions from interference of two overlayed code-decode operations known respectively as external and internal code-decodes. In accordance with the present invention, first (external) code-decode is performed by devices housed in the terminal equipment; here coding is accomplished in the transmitter terminal and decoding is accomplished in the receiver terminal. The second coding (internal) is accomplished in the intermediate transponder while the corresponding decoding is accomplished in the receiving terminal.

FIG. 1 shows an non-limiting example a possible block diagram for a system according to the present invention, in which the digital signal to be transmitted (TXSG) is encoded through an external code device (EXCD); digital signal TXSG' so obtained (with a bit rate greater than TXSG) is used to modulate through modulator MOD 1, a transmission carrier later amplified by transmitter TEQ 1 and radiated by antenna ANT1. The RF signal sent by the transmitter is received by the intermediate transponder through antenna ANT2, receiver REQ2, and demodulator DEM1, which reconstitute signal TXSG', save for transmission errors. The signal so received is once again encoded by internal coder INCD, obtaining a new digital signal TXSG'' which has a bit rate even higher than TXSG'. The TXSG' signal is then used to modulate a second RF carrier by means of MOD2 modulator, later amplified by TEQ2 and radiated by antenna ANT3.

The RF signal sent by the transponder is received by the receiver terminal through ANT4 and through receiver (REQ2) and demodulation (DEM2) units, a RXSG'' signal is rebuilt, coinciding, save for transmission errors, with signal TXSG''. This signal is decoded by internal decoder INDC, obtaining a signal RXSG' which, save for transmission errors, coincides with signal TXSG'.

This last signal is decoded by external decoder EXDC so as to rebuild signal RXSG which, save for transmission errors, coincides with transmitted signal TXSG.

The present invention makes possible transmitter terminal-transponder and transponder-receiver terminal links that are protected by diversified coding schemes which can be chosen as a function of specific applications requirements.

The invention concerns a concatenated code-decode system for the protection against interference when digital signals are transmitted, through a regenerative transponder.

The invention may be used in digital telecommunications systems using an intermediate regenerative transponder where it is necessary to protect terminal-transponder and transponder-terminal links through diversified redundancy codes. The system is particularly suited for satellite applications, because protecting the down-link with an independent code (which is therefore independent of the on-board thermal noise values and up-link errors) improves performance for the same band and power level, when compared to systems in which the internal coding is accomplished at the transmitter terminal.

This invention may be used in a number of applications concerning digital signal transmission and, in particular, it can be used within digital telecommunications, via satellite, where the down-link is, generally, more critical than the up-link due to the limited transmitter power available in the satellite.

The use of on-board satellite encoding improves down-link characteristics using the same bandwidth and transmitted power and, leaving unchanged the up-link characteristics (in term of bit rate, power, and band). This is particularly advantageous when the satellite is called to receive a plurality of carriers modulated by different digital signals and to transmit on the down-link a single carried modulated by a single digital signal obtained by multiplexing the digital signals received through the up-link (FDMA/TDM access). Here the adoption of two distinct codes, the external code on signals transmitted through the up-link and the internal code on the down-link, optimizes the utilization of bandwidth and power in both the up- and down-links.

In particular, since, in the majority of satellite applications, the available bandwidth amplitude in up-link is equal to that available in down-link, in FDMA-TDM systems with TDM signal bit rate equal to the sum of up-link transmitted digital signal bit rates, down-link bandwidth will exceed the bandwidth of the RF signal (because all band margins typical of FDMA access are used).

Thus, by using the technique of the present invention, it is possible to increase TDM signal bit rate by adapting it to the width of the band available, when bit rate increment is used for internal coding, thus improving overall performance of the system.

The literature shows a number of applications of concatenated code-decode devices using coders and decoders which are internal and external, developed in connection with transmitter and receiver terminals applications in which the internal coding is performed within the transponder to protect the sole transponder-receiver terminal link appear to be unknown.

In the previously known devices, the internal code-decode process will be affected by the errors on the transmitter terminal-transponder link and by the contribution of transponder receiver noise: therefore the limit value acceptable (threshold) for signal to noise ratio of the repeater to receiver terminal link is higher than it is for the present invention in which such contributions do not affect internal code-decode. Therefore the attenuations introduced in the repeater-receiver terminal link of the previously-known devices have greater impact on the error margin of the decoded signal compared to when the internal code-decode is applied to the sole transponder-receiver terminal link, as in the present invention.

BRIEF DESCRIPTION OF THE DRAWINGS

A preferred embodiment of the present invention is now described with reference to the drawings in which:

FIG. 1 is a block diagram of a code-decode system in accordance with the invention;

FIG. 2 is a block diagram of one embodiment of the internal coder INCD of FIG. 1;

FIG. 3 is a diagram of signal waveforms in the embodiment of FIG. 2; and

FIG. 4 is a block diagram of a second embodiment of the internal coder INCD of FIG. 1.

DETAILED DESCRIPTION OF THE INVENTION

FIG. 1 shows a block diagram of the concatenated code-decode system:

| | |
|---|---|
| EXCD: | external coder (in the transmitter terminal) |
| MOD1: | modulator 1 (in the transmitter terminal) |
| TEQ1: | transmitter 1 (in the transmitter terminal) |
| ANT1: | antenna 1 (in the transmitter terminal) |
| ANT2: | antenna 2 (in the transponder) |
| REQ1: | receiver 1 (in the transponder) |
| DEM1: | demodulator 1 (in the transponder) |
| INCD: | internal coder (in the transponder) |
| MOD2: | modulator 2 (in the transponder) |
| TEQ2: | transmitter 2 (in the transponder) |
| ANT3: | antenna 3 (in the transponder) |
| ANT4: | antenna 4 (in the receiver terminal) |
| REQ2: | receiver 2 (in the receiver terminal) |
| DEM2: | demodulator 2 (in the receiver terminal) |
| INDC: | internal decoder (in the receiver terminal) |
| EXDC: | external decoder (in the receiver terminal) |

FIG. 2 shows a block diagram of the internal coder (embodiment no. 1):

| | |
|---|---|
| F1, F2, ... $F_{n+1}$ | D-type flip flops |
| XOR1, XOR2, ... XORq | exclusive OR logic gates |
| SHR1, SHR2 | shift registers |

FIG. 3 illustrates the signal waveforms, in which

| | |
|---|---|
| CK1, CK2 | input (CK1) and output (CK2) clock signals |
| TXSG' | digital signal to be coded |
| TXSG'' | coded digital signal |
| PRLD | data transfer signal |
| CLR | erase signal |

FIG. 4 is a block diagram of the internal coder (embodiment no. 2):

| | |
|---|---|
| SHR1, SHR2 | shift registers |
| F1 | D-type flip flop |
| Look-up table | read only memory (ROM or EPROM) |

FIG. 1 shows the block diagram of a system which uses a concatenated code-decode system and transmits a digital signal from a transmitter terminal to a receiver terminal through an intermediate transponder.

With reference to FIG. 1, system operation may be described as follows:

a. Within the transmitter terminal there is a digital signal (TXSG) which is to be sent to the receiver terminal signal TXSG is coded through a device EXCD which adds sufficient information to it so as to protect it against possible errors which could be introduced in the transmitter-transponder terminal.

b. Digital signal TXSG' so obtained (with a bit rate greater than TXSG) is used to modulate, through modulator MOD1, a transmitter carrier signal. The carrier signal is then amplified by transmitter device TEQ1 and radiated through antenna ANT1.

c. The radio carrier transmitted by the transmitter is received by the transponder through antenna ANT2, receiver REQ1 and demodulator DEM1, which reconstitutes, save for transmission errors, signal TXSG'.

The signal thus received is once again coded by means of the internal coder INCD, obtaining a new digital signal TXSG'' which has a bit rate even higher than TXSG'. The type of coding to be adopted and the TXSG'' to TXSG' bit rate ratios are selected and optimized as a function of the transponder-to-receiving-terminal link characteristics (quite independently of the selections made for coding TXSG as TXSG').

d. TXSG'' is used to modulate, through MOD2 modulator, a second RF carrier, later amplified by TEQ2 and radiated through antenna ANT3.

e. The radio frequency carrier signal sent by the transponder is received by the receiving terminal through ANT4. Receiver REQ2 and demodulator DEM2 reconstitute signal RXSG'' so that it coincides with TXSG'', save for transmission errors.

f. RXSG'' is decoded by internal decoder INDC, obtaining RXSG', which, save for residual transmission errors, coincides with signal TXSG'. The latter is decoded by decoder EXDC to reconstitute RXSG, which coincides, save for possible residual transmission errors, with transmitted signal TXSG.

FIG. 2 shows a possible embodiment of internal coder INCD (FIG. 1) with the waveforms schematically shown in FIG. 3.

From signal TXSG' to be coded, clock signal CK1 is extracted with trailing edges in line with TXSG' transitions. The device required for CK1 extraction isn't shown because it is well-known.

Starting from signal CK1, by means of a phase locked oscillator, a signal CK2 is generated at frequency $(m+n)/m$ times CK1 frequency. The device required for CK2 generation isn't shown, because it is well-known.

CK2 is generated so that its leading edges coincide with those of CK1 at times T0, T1 ... contained at the bit center of TXSG' m multiples.

Starting from signals CK1 and CK2, two pulses PRLD and CLR are generated, each lined up with the latest trailing edges of CK1 and CK2 before times T0, T1 .... The duration of those pulses must be such that pulse CLR does not start to descend before the end of pulse PRLD.

With reference to the timing signals describe the structure and operation of the circuit in FIG. 2 may be summarized as follows:

a. The circuit consists of:

n+1 D-type bistable memories (F1, F2, ... $F_{n+1}$) with data input D, clock input CK, reset input CL and output Q, a shift register SHR1 with m stages with D type serial input, clock input CK1 and parallel output, a shift register SHR2 with m+n stages with parallel input, clock input CK2, load command LD and serial output Q, a plurality of exclusive OR logic gates XOR1, XOR2 ... XORq.

b. Signal CLR resets to 0 the n memories F2, F3 ... $F_{n+1}$ immediately before the start of interval Ti ... Ti+1.

c. The m leading edges of CK1 which follow insert, bit after bit, the serial signal TXSG' into shift register SHR1 and into the feedback shift register F2, F3 ... $F_{n+1}$ and logic gates XOR1, XOR2 ... XORq.

d. At the end of an m-bit cycle SR1 will be filled with the last m bits of signal TXSG'; the m memories F2, F3 ... $F_{n+1}$ will be filled with the n parity bits to be transmitted together with TXSG' m bits to give way to a BCH (Bose-Chauduri-Hocquenghem) (m+n, m) coded signal.

e. Signal PRLD transfers the m+n bits obtained above to SHR2 and they are then sequentially transmitted through memory F1 starting from the next leading edge of CK2 (which coincides with time instant $R_{i+1}$).

f. The cycle repeats with continuity, transmitting in time $T_{i+1}$-$T_{i+2}$ the coded signal produced during the time interval $T_i$-$T_{i+1}$.

FIG. 4 shows a non-delimiting example of a second possible embodiment of the internal coder (INCD, FIG. 1).

Circuit operation is the same as in FIG. 2, except that the n parity bits to be transmitted together with the m bits of signal TXSG' (from time to time stored in SHR1) are generated through a look up table rather than through a feedback shift register as in FIG. 2.

It will be apparent to one skilled in the art that other modifications and variations are possible within the spirit and scope of the present invention. For instance, one or more of the terminals may be located on mobile platforms. The platforms might be in geostationary or non-geostationary orbits or one or more might be surface, airborne or submarine mobile platforms. Similarly, the transponder might be on a surface, airborne or submarine mobile platform rather than in orbit.

We claim:

1. A concatenated code-decode system for protecting data transmissions effected through a transponder from interference, said system comprising:
   (a) a transmitter terminal having (i) means for encoding a data signal with an external code, thereby producing an external coded signal, and (ii) means for transmitting said external coded signal;
   (b) a transponder having (i) means for receiving the transmitted external coded signal, (ii) means for encoding the received external coded signal with an internal code, thereby producing an internal coded signal, and (iii) means for transmitting said internal coded signal; and
   (c) a receiving terminal having (i) means for receiving the transmitted internal coded signal, (ii) means for decoding the received internal coded signal, thereby producing a coded signal corresponding to said external coded signal, and (iii) means for decoding said coded signal corresponding to said external coded signal, thereby producing a signal corresponding to said data signal.

2. The code-decode system of claim 1 wherein the means for transmitting said external coded signal and the means for transmitting said internal coded signal utilize modulated carrier signals in the radio or the optical frequency range.

3. The code-decode system of claim 2 comprising a pluralty of transmitter terminals, each terminal having (i) means for coding a respective data signal with an external code, thereby producing a respective external coded signal, and (ii) means for transmitting said respective external coded signal to the transponder, the transponder further comprising means to multiplex the plurality of received external coded signals to a resulting multiplexed external coded signal the resulting multiplexed external coded signal thereafter being the signal that is encoded with said internal code and transmitted to said receiving terminal.

4. The code-decode system of claim 2 comprising a transmitter terminal adapted for transmitting a plurality of multiplexed data signals to the transponder, via a plurality of carrier signals at different frequencies, thus implementing an FDMA/TDM access system, or via a plurality of carrier signals having carrier frequencies that are shared in time by a plurality of transmitter terminals, thus implementing an FDM TDMA/TDM access system.

5. The code-decode system of claim 2 wherein the transmitter terminal, receiver terminal, and/or intermediate transponder, are located in satellites orbiting in geostationary or non-geostationary orbits.

6. The code-decode system of claim 2 wherein the transmitter terminal, receiver terminal, and/or intermediate transponder are located on surface, airborne, or submarine mobile platforms.

7. The code-decode system of claim 2 wherein the internal coding system is of the Bose Chauduri Hocquenghem (BCH) short code type.

8. The code-decode system of claim 2 in which the means for internal coding comprises a first shift register (SHR1-FIG. 2) of order m, a second m+n order shift register (SHR2-FIG. 2), a third shift register consisting of a plurality of memory elements (F2, F3 . . . $F_{n+1}$-FIG. 2), and a plurality of logic gates of the exclusive OR type (XOR1, . . . XORq-FIG. 2) interconnected so that a subgroup of q inputs of such memory elements is fed by the exclusive OR combination between output logic signal of the preceding element and the output logic signal of the last memory element (F1); in which the first shift register SHR1 is used for transient recording of m binary elements (bits) of the logic signal to be coded, the third shift register and the group of q XOR logic gates are used to generate the n parity bits, and the second shift register (SHR2) is used, together with the last memory element (F1) for transient memory of m+n+1 bits of the coded logic signal.

9. The code-decode system of claim 2 in which the means for internal coding comprises a first m order shift register (SHR1-FIG. 4), a second m+n order shift register, a read only memory (ROM) having a look-up table that supplies a which supplies the corresponding n parity bits for each configuration of m bits of the signal to be coded, and a memory element (F1) used for transient recording of a bit of the coded signal.

10. The code-decode system of claim 1 comprising a plurality of transmitter terminals, each terminal having (i) means for encoding a respective digital signal with an external code, thereby producing an external coded signal, and (ii) means for transmitting the respective external coded signal to said transponder, said transponder further comprising means to convert said external coded signals from said plurality of transmitter terminals to a single digital signal which is then coded with said internal code and transmitted to said receiving terminal.

11. The code-decode system of claim 10 wherein said transmitter terminals transmit one or more digital signals to said transponder via carrier signals having different frequencies, thereby implementing an FDMA/TDM access system.

12. The code-decode system of claim 10 wherein said transmitter terminals transmit one or more digital signals to said transponder via carrier signals having frequencies that are shared in time by a plurality of transmitter terminals, thereby implementing an FDM TDMA/TDM access system.

13. The code-decode system of claim 1 wherein the internal coding system is of the Bose Chauduri Hocquenghem (BCH) code type.

14. The code-decode system of claim 1 in which the means for internal coding comprises a first shift register of order m, a second shift register of order m+n (SHR2-FIG. 2), a third shift register consisting of n memory elements (F2, F3 . . . $F_{n+1}$-FIG. 2), and a plurality of logic gates of the exclusive OR type (XOR1, . . . XORq-FIG. 2) interconnected so that a subgroup of q inputs of such memory elements is fed by the exclusive OR combination between output logic signal of the preceding element and the output logic signal of the last memory element (F1); in which the first shift register SHR1 is used for transient recording of m binary elements (bits) of the logic signal to be coded, the third shift register and the group of q XOR logic gates are used to generate the n parity bits, and the second shift register (SHR2) is used, together with the last memory element (F1) for transient memory of m+n+1 bits of the coded logic signal.

15. The code-decode system of claim 1 in which the means for internal coding comprises a first shift register of order m (SHR1-FIG. 4), a second m+n order shift register, a read only memory (ROM) used as a look-up table, which supplies the corresponding n parity bits for each configuration of m bits of the signal to be coded, and a memory element (F1) used for transient recording of a bit of the coded signal.

* * * * *